(12) United States Patent
Ehlers et al.

(10) Patent No.: US 7,065,105 B2
(45) Date of Patent: Jun. 20, 2006

(54) APPARATUS FOR SHAPING THE OUTPUT BEAM OF SEMICONDUCTOR LASERS

(75) Inventors: Bodo Ehlers, Canton, MI (US); Stefan Heinemann, Ann Arbor, MI (US); Falk Doerfel, Ann Arbor, MI (US)

(73) Assignee: Fraunhofer USA, Inc., Plymouth, MI (US)

( * ) Notice: Subject to any disclaimer, the term of this patent is extended or adjusted under 35 U.S.C. 154(b) by 214 days.

(21) Appl. No.: 10/661,324

(22) Filed: Sep. 12, 2003

(65) Prior Publication Data

US 2004/0146083 A1 Jul. 29, 2004

Related U.S. Application Data

(60) Provisional application No. 60/410,212, filed on Sep. 12, 2002.

(51) Int. Cl.
*H01S 3/10* (2006.01)
*H01S 3/00* (2006.01)
*H01S 3/08* (2006.01)

(52) U.S. Cl. .................... 372/9; 372/50.12; 372/99; 372/102

(58) Field of Classification Search ............ 372/50.12, 372/9, 99, 102
See application file for complete search history.

(56) References Cited

U.S. PATENT DOCUMENTS

| | | | |
|---|---|---|---|
| 3,932,702 A | 1/1976 | Shelley et al. | |
| 4,056,827 A | 11/1977 | Spooner et al. | |
| 4,128,308 A | 12/1978 | McNaney | |
| 4,149,773 A | 4/1979 | Reid | |
| 4,370,026 A | 1/1983 | Dubroeucq et al. | |
| 4,811,328 A | 3/1989 | Ito et al. | |
| 4,828,371 A | 5/1989 | McCaslin et al. | |
| 4,921,338 A | 5/1990 | Macken et al. | |
| 5,025,438 A | 6/1991 | Emoto | |
| 5,052,815 A | 10/1991 | Nightingale et al. | |
| 5,170,409 A | 12/1992 | Nightingale et al. | |
| 5,381,439 A | 1/1995 | English, Jr. et al. | |
| 5,513,201 A | 4/1996 | Yamaguchi et al. | |
| 5,557,475 A | 9/1996 | Nightingale et al. | |
| 5,636,069 A | 6/1997 | Nightingale et al. | |
| 5,798,877 A | 8/1998 | Nightingale et al. | |

(Continued)

FOREIGN PATENT DOCUMENTS

DE 3904896 2/1989

(Continued)

*Primary Examiner*—Minsun Harvey
*Assistant Examiner*—Marcia Golub
(74) *Attorney, Agent, or Firm*—Young & Basile, P.C.

(57) ABSTRACT

An apparatus for shaping the output beam of a strip of lasers, or an array of such strips, comprising a first reflective member including at least a first reflective element for deflecting a first portion of the output beam in a first direction oriented at a first angle in the slow axis direction and at a second angle in the fast axis direction, and at least a second reflective member including at least a first reflective element for deflecting the first output beam portion from the first direction to a second direction in the Z axis. The output beam is thus shaped to define at least two beams comprising at least the first portion and a remainder of the output beam which is propagated along the Z axis without deflection by any reflective member, with the first portion of the output beam being oriented approximately parallel to the un-deflected remainder.

21 Claims, 13 Drawing Sheets

U.S. PATENT DOCUMENTS

| | | | |
|---|---|---|---|
| 6,028,722 A | 2/2000 | Lang | |
| 6,124,973 A | 9/2000 | Du et al. | |
| 6,240,116 B1 | 5/2001 | Lang et al. | |
| 6,377,410 B1 | 4/2002 | Wang et al. | |
| 6,385,228 B1 * | 5/2002 | Dane et al. | 372/99 |

FOREIGN PATENT DOCUMENTS

| | | |
|---|---|---|
| EP | 0452069 | 8/1991 |
| EP | 0468319 | 12/1991 |
| EP | 0512816 | 6/1992 |
| JP | 63-153514 | 6/1988 |

* cited by examiner

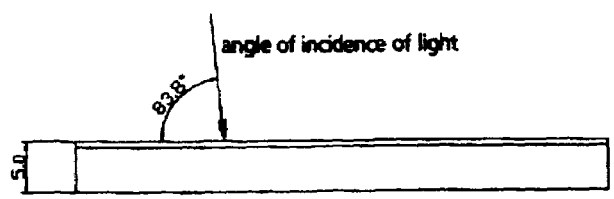
FIG. 5B
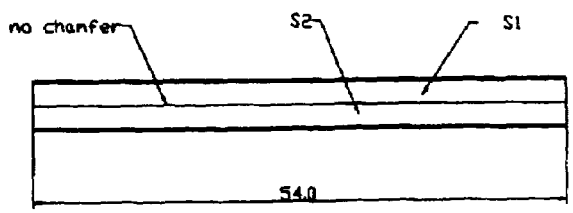
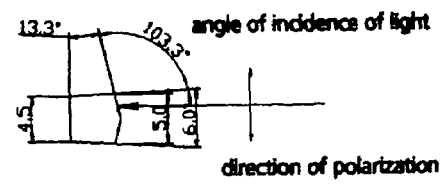
FIG. 5C
FIG. 5A

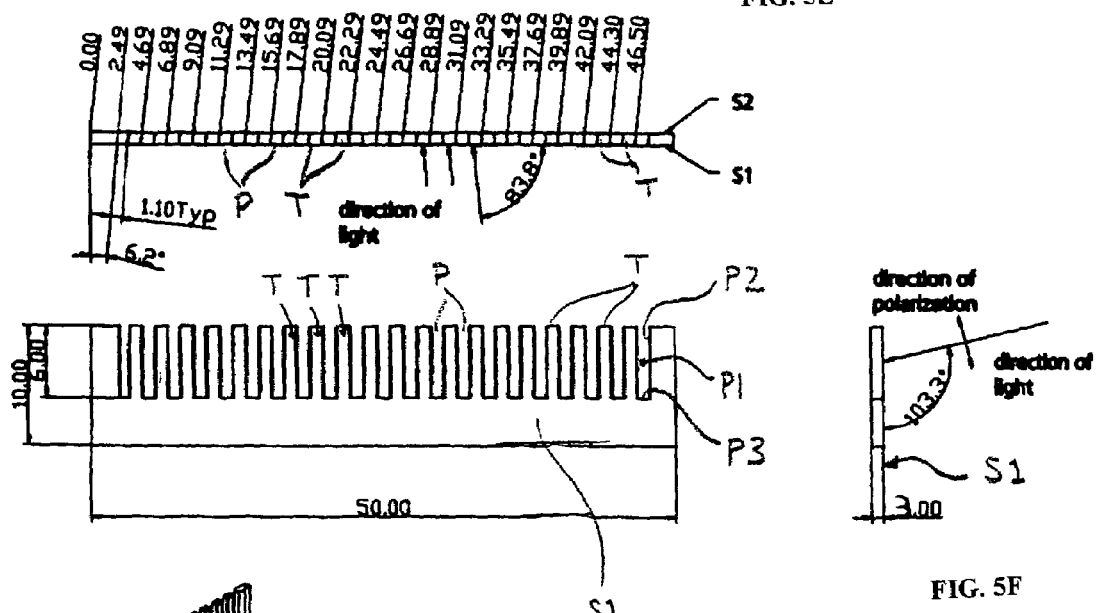
FIG. 5E
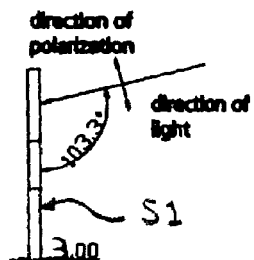
FIG. 5F
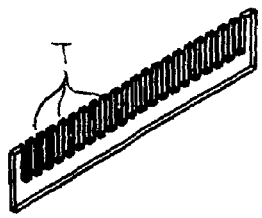
FIG. 5G
FIG. 5D

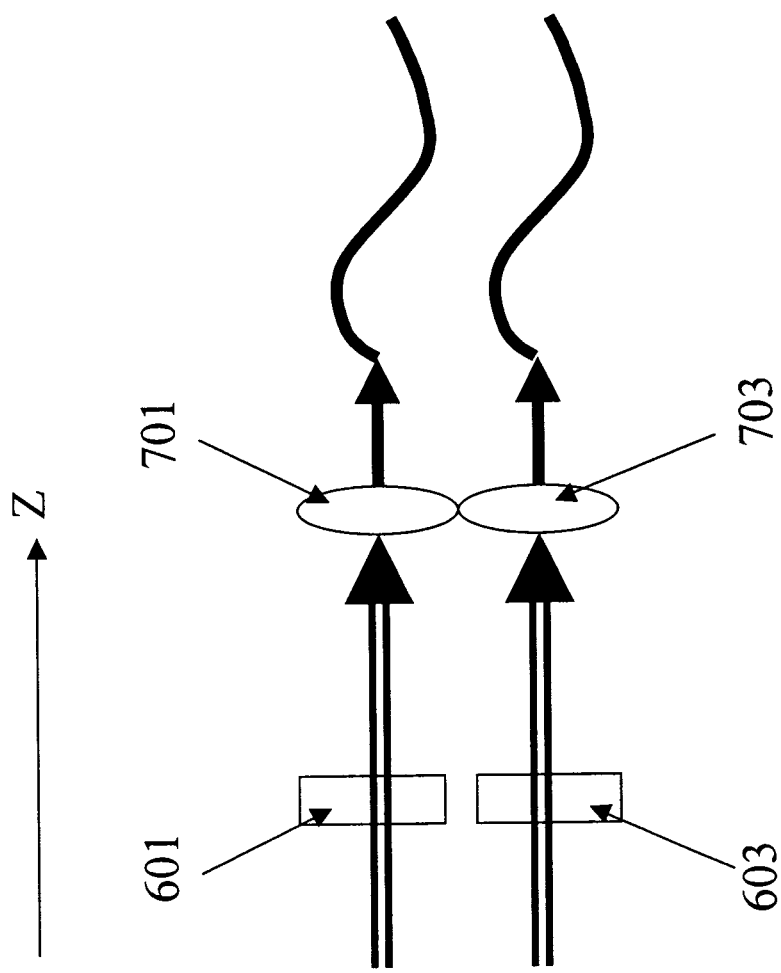
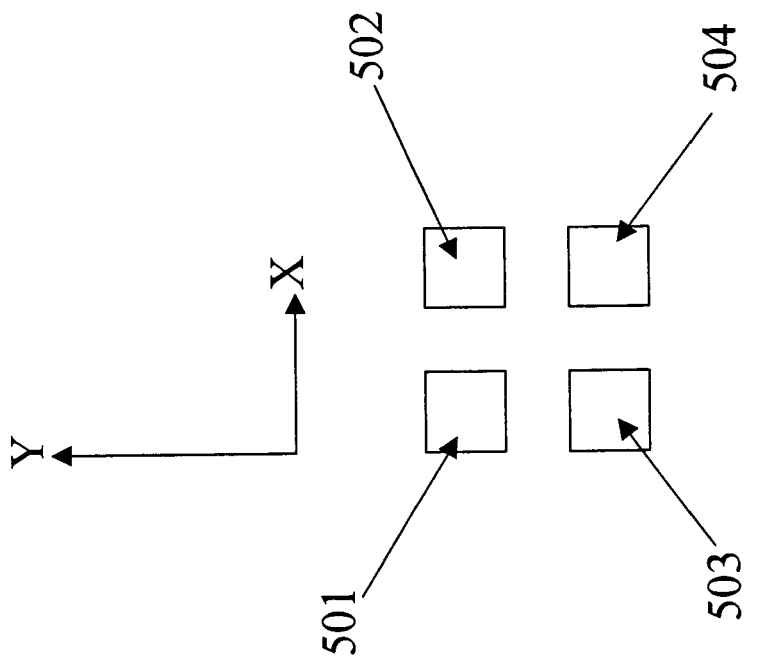
Figure 8B
Figure 8A

APPARATUS FOR SHAPING THE OUTPUT BEAM OF SEMICONDUCTOR LASERS

RELATED APPLICATIONS

This application is related to, and claims the benefit of priority from, U.S. Provisional Patent Application Ser. No. 60/410,212, filed Sep. 12, 2002.

GOVERNMENT FUNDING

This invention was made with government support under Contract No. F29601-01-2-0066 awarded by the United States Air Force, DET8AFRL/PKDL. The Government has certain rights in this invention.

FIELD OF THE INVENTION

The present invention relates to semiconductor lasers, including for example diode lasers arranged in arrays, and more particularly to an apparatus for shaping the collective output beam of such lasers in order to improve the beam quality by minimizing non-light-emitting areas.

BACKGROUND

Lasers have been around in one form or another for the past fifty years. More recently, semiconductor materials have come to be employed as a lasing medium. In semiconductor lasers generally, the requisite population inversion is established by pumping excess ions into the conduction band. Stimulated emission—that is, lasing—occurs as the electrons fall across the band gap.

High power diode lasers are one form of semiconductor laser which convert electrical energy into laser emissions—that is, coherent light—at a relatively high efficiency, typically greater than 50%. Typical individual diode lasers are approximately 10 mm wide and approximately 0.1 mm high. While such diode lasers operating singly emit about 50 watts (W) of continuous output power, this output can be scaled upwardly into the kilowatt (kW) range by assembling individual diode lasers in a so-called stacked array.

Conventionally, a stacked array comprises several individual strips, or bars, of diode lasers arranged one on top of the other in the Y axis, with each bar in turn consisting of a linear series of individual diode lasers having their radiation-emitting openings arranged in a straight line and paralleling the same plane (X-Y) as the strips. A heat sink is commonly associated with each strip. In a typical diode laser array, individual diode lasers in a given strip are placed equidistant apart along a fixed-distance, for instance 10 mm. Each individual diode laser in the strip is characterized, typically, by a light emitting area of about 2.0 mm in the X axis, and about 0.001 in the Y axis. Typical divergence for these lasers is about 10 degrees full angle in the X axis, and about 90 degrees full angle in the Y axis. Thus, a single diode laser strip having a 10 mm width exhibits an emitting area of about 10 mm in the X axis and about 0.001 mm in the Y axis, with divergence of about 10 degrees in the X axis and about 90 degrees in the Y axis.

Their high conversion efficiency, as well as their relatively compact size and long operating life, make semiconductor lasers such as diode lasers an attractive choice for pumping-type solid-state lasers, such as Neodymium:Yttrium Aluminum Garnet (Nd:YAG) lasers, and for use in a variety of material processing applications, including, for example, surface heat treatment, laser cutting, laser welding, etc.

Despite their advantages, however, conventional diode lasers, particularly in the stacked array form, are characterized by limited beam quality and a highly asymmetric output beam. Importantly, these drawbacks prohibit focusing the laser output beam on a small focal point, a common requirement in material processing applications.

State of the art optical assemblies for symmetrizing the output beam and increasing brightness thereof employ refractive optical elements which section the output beam. This approach mandates very close manufacturing tolerances and precise assembly, in consequence of which such state of the art optical assemblies are high in cost.

It would therefore be desirable to provide for an optical assembly for shaping the output beam of one or more semiconductor lasers which is at once more economical to manufacture, and which overcomes other drawbacks found in conventional optical assemblies.

SUMMARY OF THE DISCLOSURE

The specification describes an apparatus for shaping part of the collective output beam of a plurality of semiconductor lasers, including a stacked array of such lasers, the plurality of semiconductor lasers being arranged to define a plurality of light-emitting areas and a plurality of non-light-emitting areas, and the semiconductor lasers having dimensions in X, Y and Z axes, wherein the Y axis defines a fast axis, the X axis defines a slow axis, and the Z axis defines an axis of propagation for the output beam. The inventive apparatus itself comprises a first reflective member comprising at least a first reflective element positioned a fixed distance from the semiconductor lasers, the at least first reflective element adapted to deflect a first portion of the output beam in a first direction oriented at a first angle in the slow axis direction and at a second angle in the fast axis direction; and at least a second reflective member comprising at least a first reflective element positioned a fixed distance from the semiconductor lasers, the at least first reflective element of the second reflective member adapted to deflect the first portion of the output beam from the first direction to a second direction in the Z axis direction. By so shaping the collective output beam, the first portion of the output beam is oriented approximately parallel to the un-deflected remainder of the output beam, and the non-light-emitting areas are substantially eliminated from the output beam.

According to one embodiment of the present invention, the first reflective member further comprises a second reflective element positioned a fixed distance from the semiconductor lasers, the second reflective element adapted to deflect a second portion of the output beam in a third direction oriented at a third angle in the slow axis direction and at a fourth angle in the fast axis direction; and the at least second reflective member comprises a second reflective element positioned a fixed distance from the semiconductor lasers, the at least second reflective element of the second reflective member adapted to deflect the second portion of the output beam from the third direction to a fourth direction in the Z axis direction. According to this embodiment, the first and second portions of the output beam are oriented approximately parallel to each other and to the un-deflected remainder of the output beam, and the non-light-emitting areas are substantially eliminated from the output beam.

In one form of this embodiment, the third direction is approximately opposite the first direction, the first and third angles are approximately the same, the second and fourth angles are approximately the same, and the second and fourth directions are approximately the same.

According to yet another embodiment, the first reflective element is adapted to deflect a second portion of the output beam in a third direction oriented at a third angle in the slow axis direction and at a fourth angle in the fast axis direction; and the at least second reflective member comprises a second reflective element positioned a fixed distance from the semiconductor lasers, the at least second reflective element of the second reflective member adapted to deflect the second portion of the output beam from the third direction to a fourth direction in the Z axis direction. Per this embodiment, the first and second portions of the output beam are oriented approximately parallel to each other and to the un-deflected remainder of the output beam, and the non-light-emitting areas are substantially eliminated from the output beam.

In one form of this embodiment, the third direction is approximately opposite the first direction, the first and third angles are approximately the same, the second and fourth angles are approximately the same, and the second and fourth directions are approximately the same.

In any of the foregoing embodiments, the invention may further comprise at least one optical member adapted to balance the optical path length of the un-deflected remainder of the output beam, the at least one optical member being disposed at a fixed position in the axis of propagation of the un-deflected remainder of the output beam.

The present invention is well suited to shaping the collective output beam of a stacked array of semiconductor lasers, and the invention, according to one feature thereof, comprises an apparatus for shaping part of the collective output beam of a plurality of semiconductor lasers comprising individual bars of semiconductor lasers stacked one on top of the other to form an array, the plurality of semiconductor lasers being arranged to define a plurality of light-emitting areas and a plurality of non-light-emitting areas, and the array having dimensions in X, Y and Z axes, wherein the Y axis defines a fast axis, the X axis defines a slow axis, and the Z axis defines an axis of propagation for the output beam. Per this feature, the inventive apparatus particularly comprises a first reflective member comprising at least a first reflective element positioned a fixed distance from each bar in the array, the at least first reflective element adapted to deflect a first portion of the output beam from each bar in the array in a first direction oriented at a first angle in the slow axis direction and at a second angle in the fast axis direction; and at least a second reflective member comprising at least a first reflective element positioned a fixed distance from each bar in the array, the at least first reflective element of the second reflective member adapted to deflect the first portion of the output beam from each bar from the first direction to a second direction oriented in the Z axis direction. By so shaping the output beams of each bar in the array, the first portion of the output beams of each bar in the array are oriented approximately parallel to the un-deflected remainder of the output beams of each bar, and the non-light-emitting areas are substantially eliminated from the output beams.

In one embodiment of the inventive apparatus, the first reflective member further comprises a second reflective element positioned a fixed distance from each bar in the array, the second reflective element adapted to deflect a second portion of the output beam from each bar in a third direction oriented at a third angle in the slow axis direction and at a fourth angle in the fast axis direction; and the at least second reflective member comprises a second reflective element positioned a fixed distance from each bar in the array, the at least second reflective element of the second reflective member adapted to deflect the second portion of the output beam of each bar from the third direction to a fourth direction in the Z axis direction. Per this embodiment, the first portion and second portion of the output beams of each bar in the array are oriented approximately parallel to the un-deflected remainder of the output beams of each bar, and the non-light-emitting areas are substantially eliminated from the output beams.

According to one aspect of this embodiment, the third direction is approximately opposite the first direction, the first and third angles are approximately the same, the second and fourth angles are approximately the same, and the second and fourth directions are approximately the same.

In yet another embodiment, the at least first reflective element is adapted to deflect a second portion of the output beam of each bar in a third direction oriented at a third angle in the slow axis direction and at a fourth angle in the fast axis direction; and the at least second reflective member comprising a second reflective element positioned a fixed distance from each bar in the array, the at least second reflective element of the second reflective member adapted to deflect the second portion of the output beam from the third direction to a fourth direction in the Z axis direction. Per this embodiment, the first portion and second portion of the output beams of each bar in the array are oriented approximately parallel to the un-deflected remainder of the output beams of each bar, and the non-light-emitting areas are substantially eliminated from the output beams.

According to one aspect hereof, the third direction is approximately opposite the first direction, the first and third angles are approximately the same, the second and fourth angles are approximately the same, and the second and fourth directions are approximately the same.

In any of the foregoing embodiments, the invention may further comprise at least one optical member adapted to balance the optical path length of the un-deflected remainder of the output beam of at least one bar in the array, the at least one optical member being disposed at a fixed position in the axis of propagation of the un-deflected remainder of the output beam.

According to one feature of the foregoing embodiments, the total height of the first and second reflective members corresponds to the pitch of the semiconductor lasers in the array.

According to another feature of the foregoing embodiments, the output beams of each bar in the array are propagated in a direction substantially perpendicular to a plane defined by the X and Y axes.

Per still another feature of this invention, the at least first element of the second reflective member comprises a monolithic element having a plurality of individual reflective portions each adapted to reflect a portion of the output beam of a discrete one of the bars in the array, and a plurality of cut-out portions defined between adjacent reflective portions, each cut-out portion adapted to permit transmission therethrough of a portion of the output beam of a discrete one of the bars in the array. The cut-out portions include opposing inside surfaces, each of which inside surfaces is oriented approximately parallel to the path of travel of the portion of the output beam transmitted therethrough. Per one aspect hereof, opposing inside surfaces of each cut-out portion include an anti-reflective coating.

BRIEF DESCRIPTION OF THE DRAWINGS

The written description herein makes reference to the accompanying drawings, wherein like numerals refer to like or corresponding parts throughout the several views, and wherein:

FIGS. 5A–5C depict a first embodiment of the first reflective member of the apparatus of the present invention in, respectively, lateral, top-down, and end-view elevations;

FIGS. 5D–5G depict a first embodiment of the second reflective member of the apparatus of the present invention in, respectively, lateral, top-down, and end-view elevations, and in perspective view;

FIG. 8A depicts the near field of an exemplary set-up of a stacked array assembled with a symmetrizing element which creates four identical spots arranged equidistant in each of the fast and slow axis directions; and FIG. 8B is a schematic view, taken along the X axis, of another embodiment of the apparatus of the present invention, wherein the laser beams of a stacked array of high power diode lasers are combined with a symmetrizing device which creates four identical spots arranged equidistant in both the fast and slow axis directions, as well as optical switches allowing independent power variations in each individual beam.

WRITTEN DESCRIPTION

With reference being had to the drawings, wherein like numerals indicate like or corresponding parts, the present invention will be seen to comprise an apparatus for shaping part of the output beam of a semiconductor laser, including in the form of an array of laser diodes, the semiconductor laser having dimensions in X, Y and Z axes, the Y axis defining a fast axis, the X axis defining a slow axis, and the Z axis defining an axis of propagation for the output beam. The inventive apparatus generally comprises a first reflective member comprising at least a first reflective element positioned a fixed distance from the semiconductor laser, the at least first reflective element adapted to deflect a first portion of the output beam in a first direction and at a first angle in the slow axis direction and a second angle in the fast axis direction, and at least a second reflective member comprising at least a first reflective element positioned a fixed distance from the semiconductor laser, the at least second reflective element adapted to deflect the first portion of the output beam in a third direction in the Z axis direction so that the first portion of the output beam is oriented parallel to the un-deflected remainder of the output beam, and the non-light-emitting areas of the laser are substantially eliminated from the output beam.

Figure 1A:
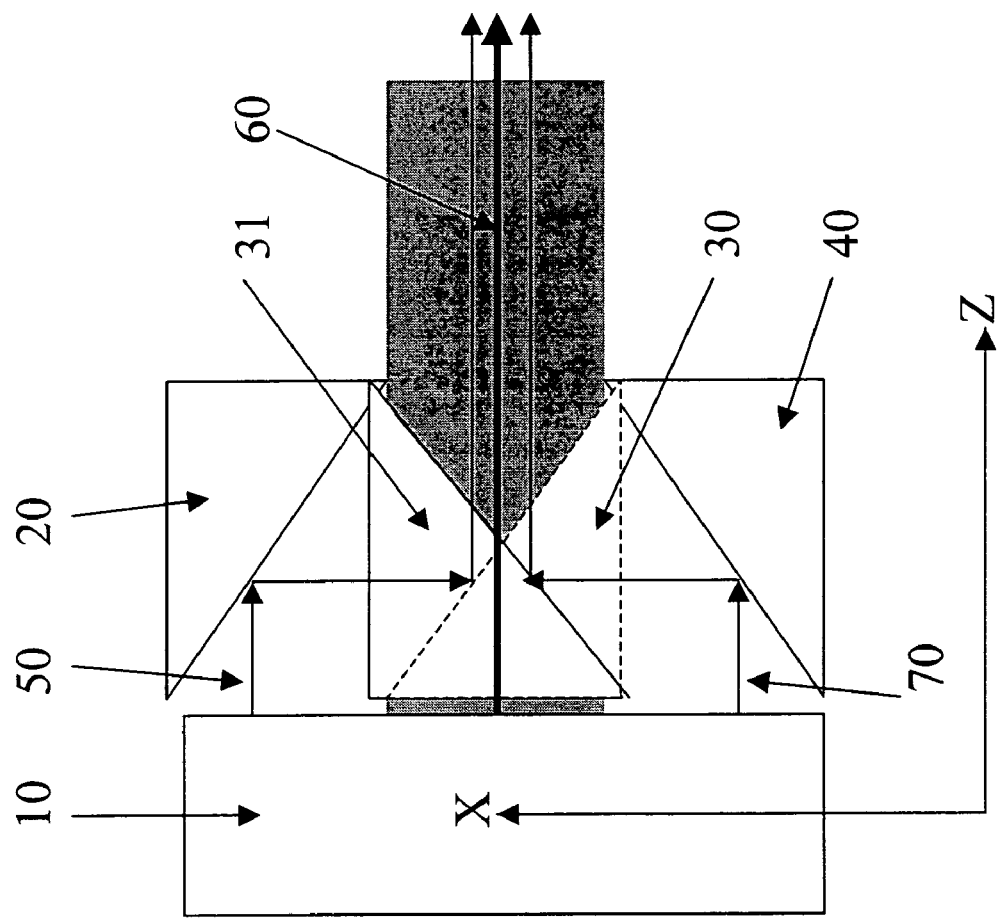
FIG. 1A is a schematic view, taken along the Y axis, of one embodiment of the apparatus of the present invention, wherein the beam of a single, high power diode laser is shaped into three separate beams.
Figure 1B:
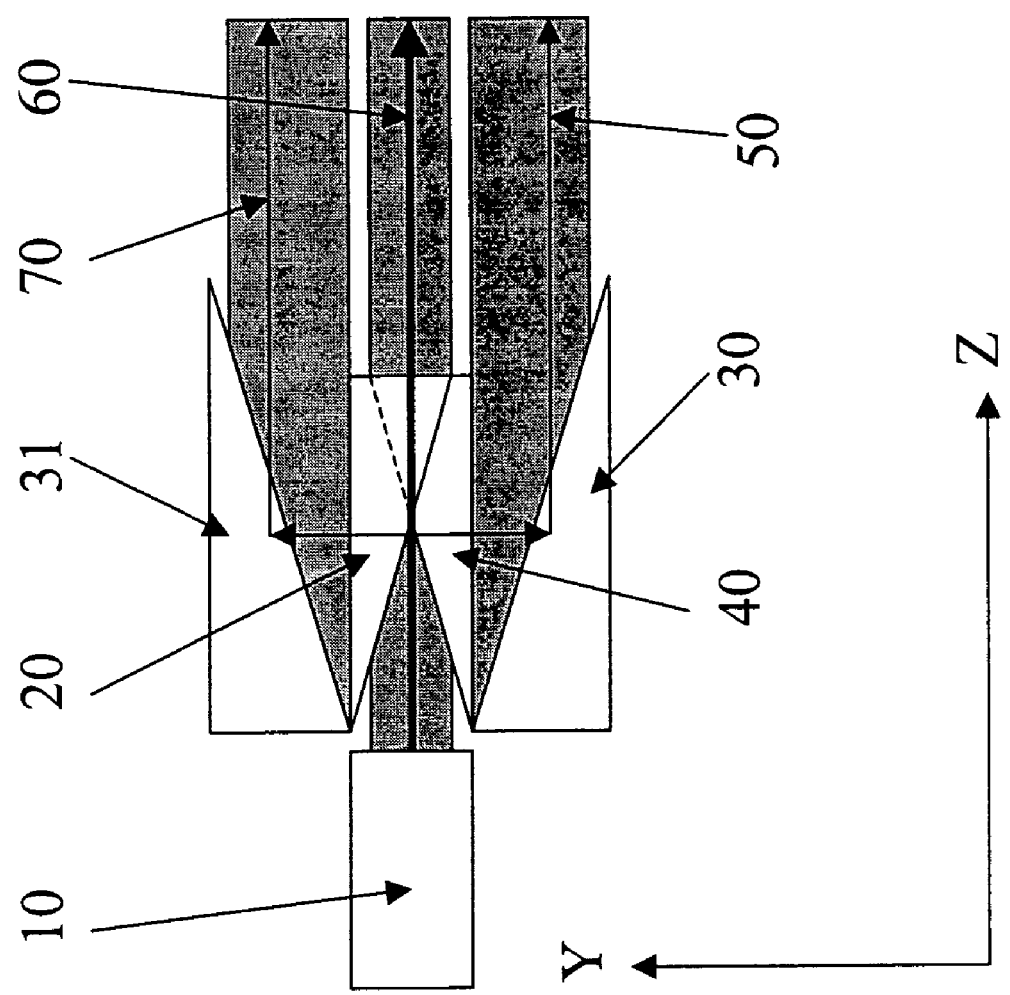
FIG. 1B is a schematic view of the embodiment of FIG. 1A taken along the X axis.

Turning now to FIGS. 1A and 1B, the inventive apparatus is shown in a first embodiment in combination with a semiconductor laser in the exemplary form of a single strip or bar 10 of high-power diode lasers having the output beam thereof collimated in the fast—or Y—axis, as well as, optionally, in the slow—or X—axis. A first reflective member comprises, in the illustrated embodiment, first and second reflective elements 20 and 40 positioned to deflect portions 50 and 70, respectively, of the output beam. The beam portion 50 is deflected by the reflective element 20 in a direction along the slow axis towards a center, un-reflected portion 60 of the output beam at an angle of approximately 90 degrees, and is further deflected downwardly along the fast axis at an angle of approximately 5 degrees. The lateral beam 70 is similarly deflected by the reflective element 40, though in the opposite direction in the X and Y axes.

A second reflective member comprises, in the illustrated embodiment, first and second reflective elements 30 and 31 positioned proximate the point of intersection of the beam portions 50 and 70. A center portion 60 of the output beam is transmitted through the first and second reflective elements 30 and 31 without being deflected thereby. As shown, the reflective element 31 deflects the beam portion 50 along the Z axis so that the beam portion 50 is parallel to the center beam portion 60 in each axis Y, Z, and at the same X coordinate. Likewise, the reflective element 30 deflects the beam portion 70 along the Z axis so that the beam portion 70 is parallel to the center beam portion 60 in each axis Y, Z.

It will be appreciated from this disclosure that the individual beam portions 50, 60 and 70 may be defined at angles other than as shown in the exemplary illustrations, the deflection angles of the above-described embodiment being for illustrative purposes only and not intended to be limiting of the present invention. The beam quality as improved by the inventive apparatus will not be affected by different deflection angles, since the beams are reflected rather than refracted.

It will also be understood from this disclosure that the output beam of the semiconductor laser, including for example the diode laser of the illustrated embodiments, may be divided by the first reflective member into any number of separate beam portions ranging from two to more than eight beam portions, depending upon the particular application concerned; the three individual beam portions of the afore-described embodiment are exemplary only.

Likewise, the laser beam output from the semiconductor laser need not be collimated at all, but may be shaped in other ways according to known means, all as necessitated by the particular application for the inventive apparatus.

Figure 2:
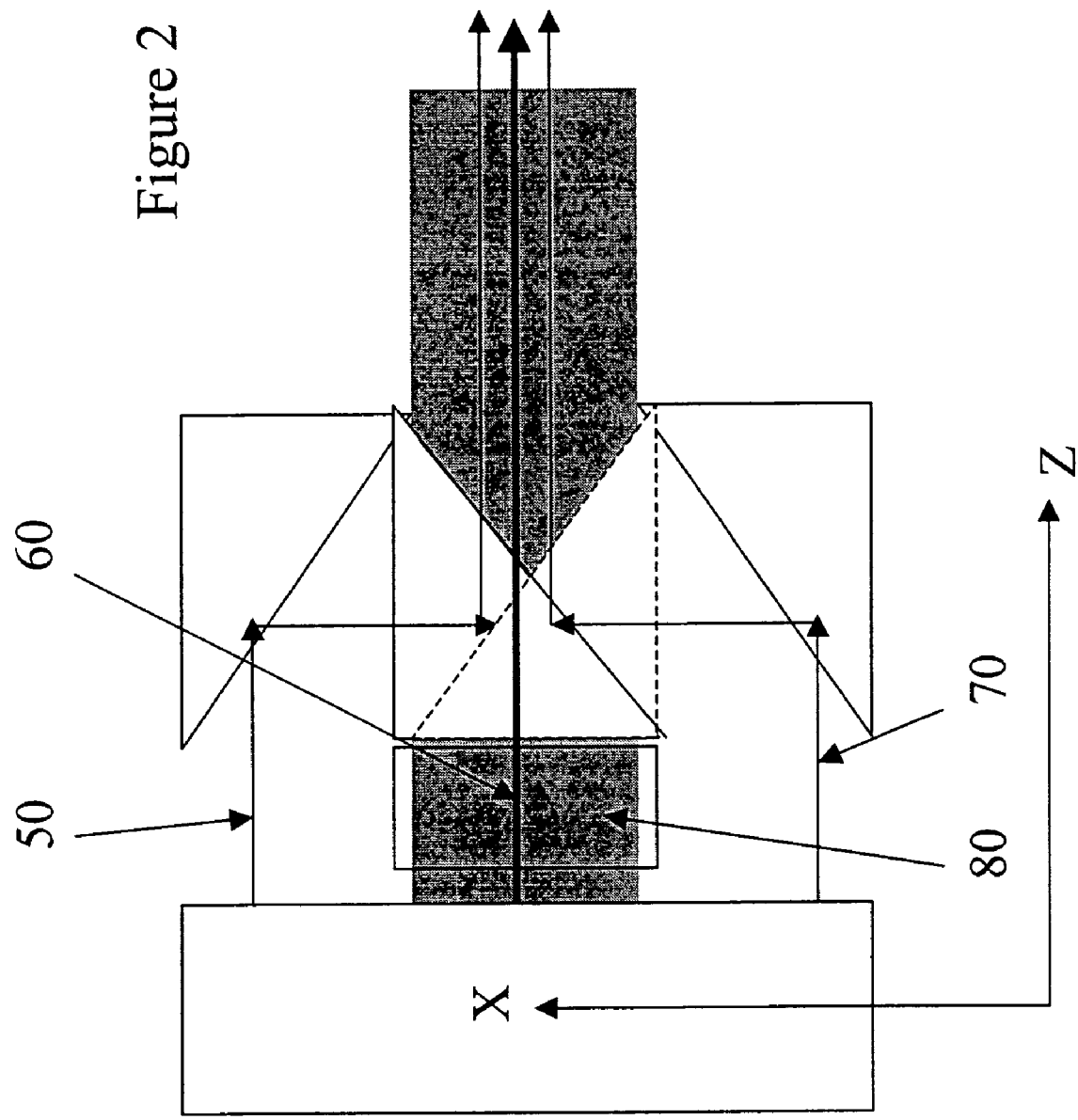
FIG. 2 is a schematic view, taken along the Y axis, of a further embodiment of the apparatus of the present invention, wherein the laser beam of a single, high power diode laser is reconfigured into three separate beams, and the apparatus includes an optical member for balancing the path length of the separate beams.

Referring now to FIG. 2, which depicts schematically a further embodiment of the present invention shown, by way of example, in combination with the apparatus of FIGS. 1A and 1B, it will be seen that the apparatus of this invention may further comprise an optical member 80 positioned along the path of the central beam portion 60 in order to balance the optical path length of the center beam portion 60 with that of the lateral beam portions 50 and 70. The optical member 80 may comprise any of the numerous forms of such devices known to those of skill in the art. Of course, the position of the optical member 80 is intended to be illustrative only, and other positions may be adopted as dictated by the particular application.

Figure 3:
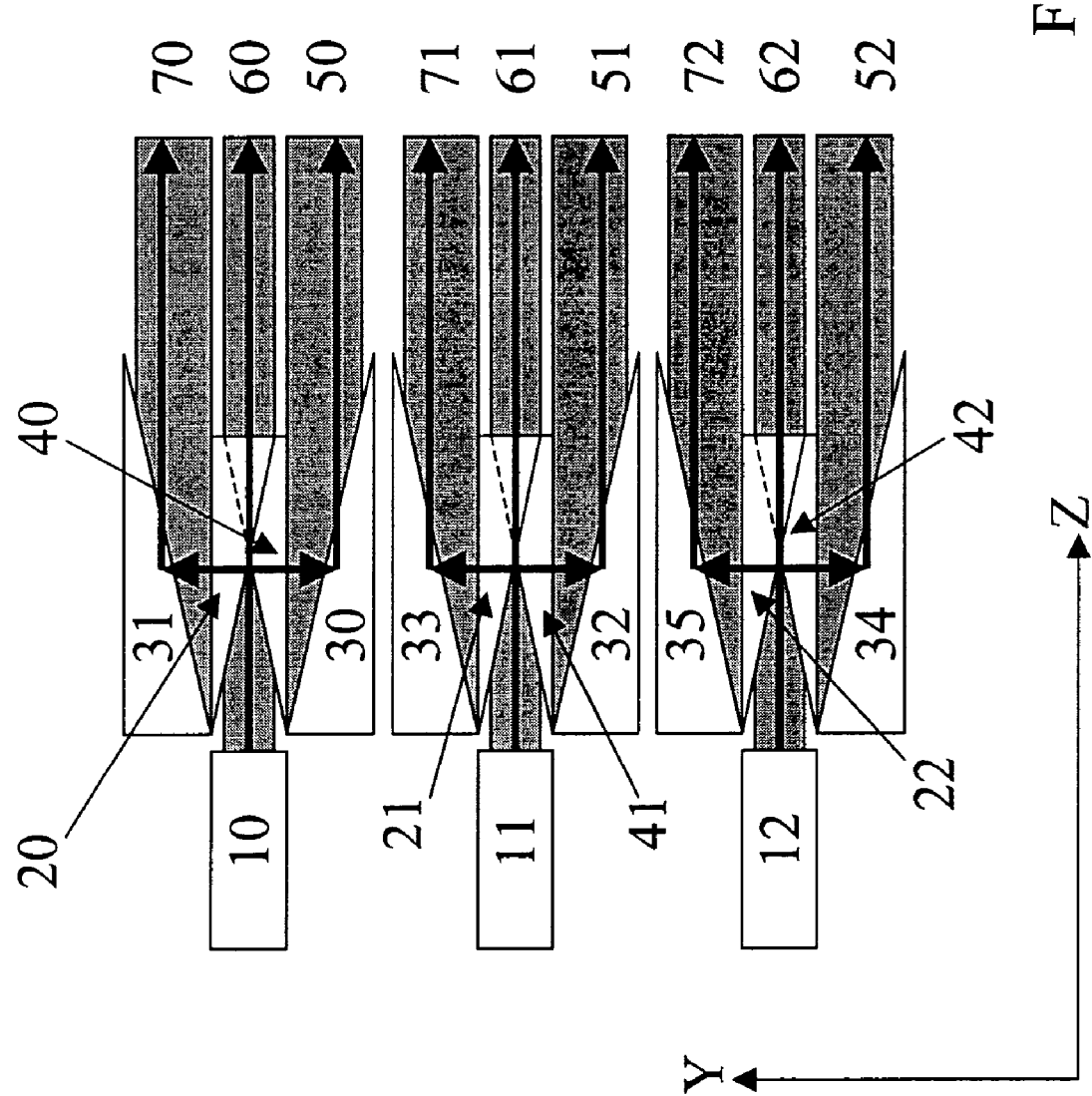
FIG. 3 is a schematic view, taken along the X axis, of a further embodiment of the apparatus of the present invention, wherein the laser beam of a stacked array of high power diode lasers is reconfigured into three separate beams.

Turning next to FIG. 3, the embodiment of FIGS. 1A and 1B is shown in combination with plural strips of diode lasers 10, 11, and 12 arranged as a stacked array. As with the embodiment of FIGS. 1A and 1B, the output beam of each diode laser 10, 11, and 12 is collimated in the fast axis (Y), as well as, optionally, in the slow axis (X), and these collimated beams are divided into separate beam portions as follows: The output beam of diode laser 10 is divided into three separate beam portions 50, 60, and 70 by a first reflective member comprising first and second reflective elements 20 and 40, which first and second reflective elements each deflect a beam portion 50 or 70, respectively, in a direction along the slow axis towards a center, un-reflected beam portion 60 of the output beam at an angle of approximately 90 degrees, and which further deflect these beam portions 50 and 70 downwardly along the fast axis at an angle of approximately 5 degrees. The center beam portion 60 is transmitted through the first and second reflective elements 30 and 31 of the second reflective member without being deflected thereby. The intersecting lateral beam portions 50 and 70 are deflected by the first and second elements 30 and 31, respectively, of the second reflective member in both of the slow and fast axes so as to be parallel to the center beam 60 in each of the Y and Z axes, all as described above in more detail with reference to FIGS. 1A and 1B. The output beam of diode laser 11 is similarly divided into separate beam portions 51 and 71 by a first reflective member comprising first and second reflective elements 21 and 41, and the intersecting lateral beam portions 51 and 71 are deflected along the Z axis by a second reflective member comprising reflective elements 32 and 33 so as to be parallel to a center, un-deflected beam portion 60 in each of the Y and Z axes. Likewise, the output beam of diode laser 12 is divided into separate beams 52 and 72 by a first reflective member comprising first and second reflective elements 23 and 42, and the intersecting lateral beam portions 52 and 72 are deflected along the Z axis by a second reflective member comprising first and second reflective elements 34 and 35 so as to be parallel to an un-deflected center beam portion 60 in each of the Y and Z axes.

The individual beam portions 50, 60, 70, and 51, 61, 71, and 52, 62, 72 of each diode laser 10, 11 and 12, respectively, are all placed in close proximity one on top of the other in the fast (Y) axis direction, as shown, so as to emerge along the Z axis parallel to each other and perpendicular to a plane defined by the fast (Y) and slow (X) axes of each diode laser 10, 11 and 12.

The individual reflective elements 20, 21, 22, 40, 41, and 42 of the first reflective member, as well as the individual reflective elements 30 31, 32, 33, 34, and 35 of the second reflective member, may each be manufactured from individual optical elements stacked on top of each other or, alternatively, may be optically bonded or made from a single component, depending upon such considerations as the particular design of the laser and the number of individual beams. Suitable materials for these reflective elements are known to those skilled in the art and may, for example, comprise glass or metal that is polished and shaped. The reflective elements are preferably affixed to a base plate (not shown) having, as desired, means for efficient heat dissipation, such as micro-channels for passing a forced liquid coolant.

Ideally, the first and second reflective members associated with each diode laser 10, 11, and 12 are characterized by a total height corresponding to the pitch of the collimated diode lasers 10, 11 and 12.

It will be appreciated from this disclosure that each collimated diode laser may be split in a different number of individual beam portions to balance the resulting beam height of the individual beams placed on top of each other in the slow (X) axis direction with the pitch of the diode lasers of the stacked array. It will also be understood that while the individual beams emerge both parallel and in close proximity to each other in the fast (Y) axis after being deflected by the reflective elements of the second reflective member, they may also be deflected to emerge under an angle with respect to the plane defined by the slow and fast axes of the diode lasers.

Figure 4A:
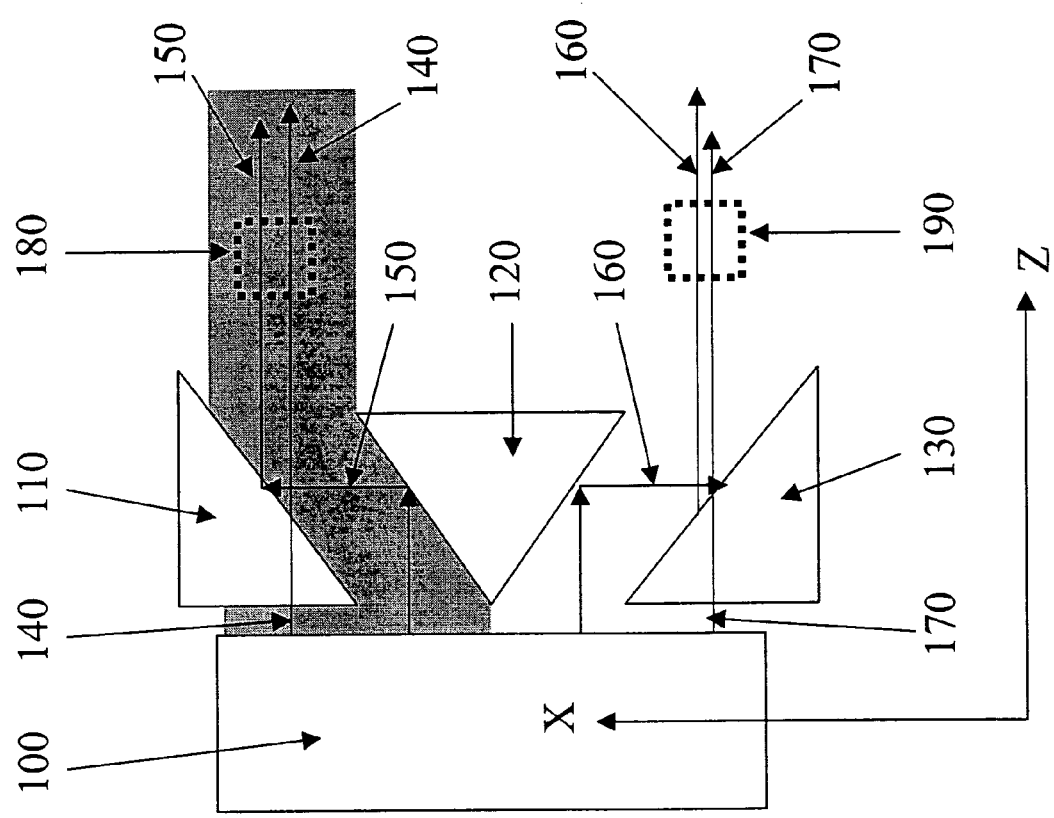
FIG. 4A is a schematic view, taken along the Y axis, of another embodiment of the apparatus of the present invention, wherein the laser beam of a stacked array of high power diode lasers is reconfigured into four separate beams, and the beams are subsequently combined in two illuminated areas.
Figure 4B:
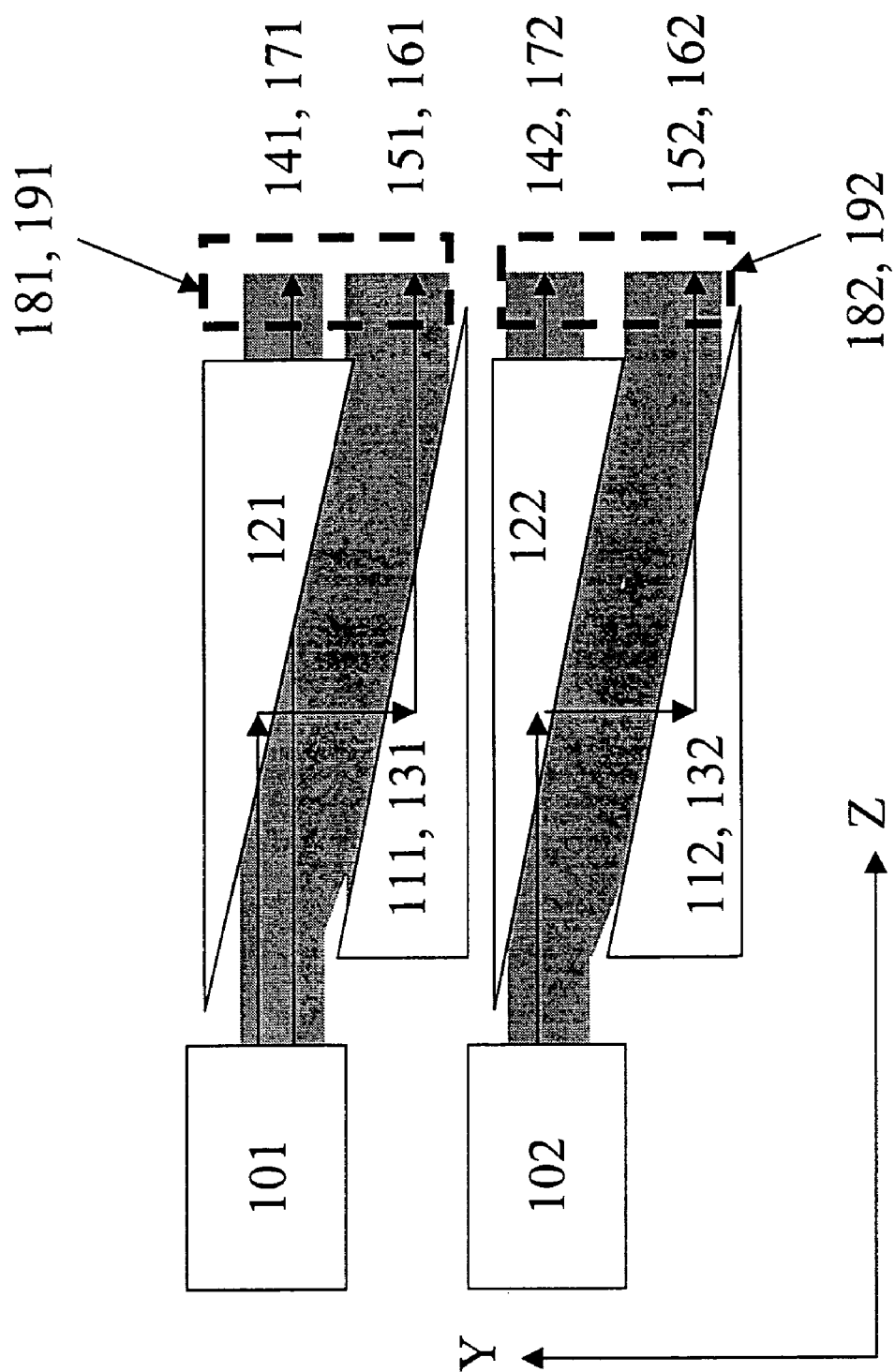
FIG. 4B is a schematic view of the embodiment of FIG. 4A, taken along the X axis.

With reference now being had to FIGS. 4A and 4B, a further embodiment of the present invention is shown in which the output beam of a stacked array of semiconductor lasers, such as the illustrated diode laser bars (only the top-most laser bar 100 is visible in FIG. 4A, which is taken along the Y axis; that is, showing the X-Z plane), is divided into multiple separate beam portions.

With specific reference to FIG. 4A, it may be seen that for each diode laser two separate beam portions 150 and 160 are defined by means of a first reflective member comprising a first reflective element 120. More particularly, the reflective element 120 will be seen to split the output beam into separate beam portions 150 and 160, with beam portion 150 being deflected in a first direction and beam portion 160 being deflected oppositely in a second direction. As illustrated, the beam portions 150 and 160 are deflected oppositely in the slow (X) axis direction at identical angles relative to the reflective surface of the reflective element 120.

Still referring to FIG. 4A, a second reflective member comprises first and second reflective elements 110 and 130, each being positioned proximate the intersections of, respectively, the un-deflected lateral beam portions 140 and 170 and the deflected lateral beam portions 160 and 170. The lateral beam portions 140 and 170 are un-deflected by the respective reflective elements 110 and 130 of the second reflective member, though it will of course be understood by those skilled in the art that the width of the beam portions 150 and 170 will necessarily be affected by the placement of the first reflective element 120 in the propagation path of these beam portions. The first reflective element 110 serves to deflect the beam portion 150 to emerge parallel to the lateral beam portion 140 in both the Y and Z axes, the beam portions 150 and 140 having the same coordinate position along the X axis. Similarly, the second reflective element 130 serves to deflect the beam portion 160 to emerge parallel to the un-reflected lateral beam portion 170 in both the Y and Z axes, the beam portions 160 and 170 having the same coordinate position along the X axis.

By operation of the first and second reflective members, as hereinabove described, the individual beam portions 150 and 160 are combined with the lateral beam portions 140 and 170 to define a pair of beams 180 and 190, respectively. (FIG. 4A.) The beams 180 and 190 are of identical dimensions and beam quality, and are further characterized in that the center of each of the beams 180 and 190 are precisely parallel to each other in both the slow (X) and fast (Y) axes, as well as being equidistant from a centerline defined parallel to the direction of propagation (Z-axis) and intersecting the X-Y plane at the center of the diode laser 100. By virtue of the shaping of the output beam according to this invention, the two beams 180 and 190 show minimized non-light-emitting area between the individual constituent beam portions 140 and 150 or 160 and 170, respectively.

Though not shown in FIGS. 4A and 4B, means for balancing the optical path lengths of the several beams, such as described in connection with the embodiment of FIG. 2, may also be employed. These means may comprise separate optical elements, or may be formed as part of a single structure further comprising the first and second reflective members.

With particular reference to FIG. 4B, wherein the embodiment of FIG. 4A is shown in conjunction with multiple semiconductor lasers 101 and 102 assembled in a stacked array, the stacked array diode laser is shown to comprise two collimated diode lasers 101 and 102, the beam of each laser being divided into four separate beams portions 141, 151, 161, and 171 or 142, 152, 162, or 172, respectively. The first reflective members associated with each diode laser 101 or 102 and comprising, respectively, reflective elements 121 and 122, are oriented in the slow (X) axis in the same manner as that shown in FIG. 4A with reference to the reflective element 120, as are the second reflective members associated with each diode laser 101 and 102 and comprising, respectively, first and second reflective elements 111 and 131 or first and second reflective elements 112 and 132. In each diode laser assembly 101 or 102, the individual beam portions 151 and 161 or 152 and 162, respectively, are deflected by the reflective elements of the aforementioned first and second reflective members in the manner described with reference to FIG. 4A, and emerge, in combination with the un-deflected lateral beam portions 141 and 171 or 142 and 172, respectively, as pairs of beams; particularly, the beams emerging from the laser diode assembly 101 comprise beams 181 and 191, made up, respectively, of beam portions 141, 171 and 151, 161; the beams emerging from the laser diode assembly 102 comprise beams 182 and 192, made up, respectively, of beam portions 142, 172 and 152, 162. These light-emitting areas are precisely aligned in all axes.

With continuing reference to FIG. 4B, it will be appreciated that multiple collimated diode lasers may be arranged one on top of the other at a specific pitch in order to scale the output power and symmetrize the beam quality of the emerging beams 181,190 and 182,192 in a laser array. The number of individual beam portions (e.g., 141, 151, 161, 171) is determined by matching the beam height of each of the beams 181,190 and 182,192 with the pitch of the stacked array comprising diode lasers 101 and 102 such that all non-light-emitting areas between the adjacent diode lasers 101 and 102 are eliminated in the fast (Y) axis. Therefore, the number of individual beam portions is calculated as the ratio of the beam height of the beams 181,190 and 182,192 and the beam height of the collimated diode lasers 101 and 102. By way of illustration, the beam height in the fast (Y) axis of a stacked array having a pitch of 2.0 mm would, likewise, be 2.0 mm. And assuming a beam height of 1.0 mm for each diode laser 101 and 102, then two individual beams (e.g., 181,190) may be arranged one on top of the other in the fast axis direction for each diode laser 101 and 102 with no non-light-emitting areas in between them.

In the slow (X) axis direction the beam quality of the light-emitting areas comprising beams 181, 182, 191 and 192 is determined by the number of individual beam portions, as well as the width and slow axis divergence of the diode lasers 101 and 102. For instance, a slow axis divergence after collimation of 80 mrad full angle and a width of the diode laser of 10 mm yields a beam parameter product in the slow axis of 200 mm*mrad. If the radiation of the diode lasers 101 and 102 are each divided in four separate beam portions combined into two light-emitting areas (e.g., 181 and 191 or 182 and 192), a beam parameter product of the individual beams in the slow axis of 50 mm*mrad will result for each light-emitting area.

In the fast (Y) axis the beam quality is determined by the number of individual beam portions comprising the light-emitting areas of beams 181 and 191 or 182 and 192, respectively, and the divergence of the collimated diode lasers 101 and 102. For example, a fast axis divergence after collimation of 8 mrad full angle and a beam height of 1 mm results in a beam parameter product in the fast axis of 2 mm*mrad for the collimated diode lasers 101 and 102. In the illustrated embodiment, the diode lasers 101 and 102 are divided into four separate beam portions each of which are combined into pairs of beams (181 and 191 or 182 and 192, respectively), with beam portions, 141, 171, or 151,161, or 142,172, or 152,162 being arranged on top of each other in the fast axis in each of beams 181, 191, 182, or 192, respectively. Consequently, the beam parameter product in the fast axis direction of the diode lasers 101 and 102 are 4 mm*mrad each, or 8 mm*mrad combined.

The beam quality of the light-emitting beam areas emerging from the first and second reflective members can be designed to balance in both of the fast (Y) and slow (X) axes. Thus, for instance, in the exemplary arrangement the number of diode lasers that must be stacked on each other in an array to achieve a beam parameter product of 50 mm*mrad in both the fast and slow axes would be 12.5.

It will of course be understood that the pitch, beam height, and divergences of the collimated diode lasers may vary with different applications and, accordingly, that the number of individual beams may likewise be varied. It will likewise be appreciated that a diode laser array incorporating the apparatus of this invention may be designed so that the beam quality of the light-emitting beam areas is not balanced in the slow and fast axes, and that more than two such light-emitting beam areas may emerge. And while the light-emitting beam areas are always aligned in all axes, the respective center beam portions need not always emerge parallel to each other in the slow and fast axes, but may instead be displaced by a predetermined amount.

As discussed, the first and second reflective members of the several embodiments of the present invention, each comprising at least one reflective element, may be monolithic or may, alternatively, be made from multiple individual elements. These reflective elements are ideally shaped as a prism or as a thin plate. For monolithic construction, by way of example, a single glass prism with highly polished surfaces may be employed.

The reflective surfaces of the reflective elements are polished to optical quality and coated with a highly reflective material to minimize transmission loss, all according to known methods. As necessary to permit the transmission of beam portions not intended to be deflected, the reflective elements may comprise both reflective and transmissive sections, being coated, for instance, with alternating sections of reflective and anti-reflective materials. Alternatively, the reflective elements may comprise only a reflective coating, while the anti-reflective sections may be achieved by removing substrate as necessary from the reflective elements to permit transmission of any beam portions not intended to be deflected. Furthermore, the functional surfaces of the reflective elements may be coated completely with an antireflective coating that is selectively covered by a high-reflective coating to provide the deflection where required.

Employing monolithic reflective elements in the apparatus of the present invention, the beams of all diode lasers in a single stacked array will be deflected precisely the same direction, and any misalignment of the emerging combined beams will be limited to that attributable to the manufacturing tolerances of relatively large optical components.

Alternatively, the first and second reflective elements may be manufactured from a unitary structure comprising a pair of glass plates having alternating sections of high transmission and reflective coatings that are inclined in the slow and fast axes relative to the plane defined by the slow (X) and fast (Y) axes. According to this embodiment, the glass plates may be optically bonded.

Since the deflection angles are identical for all collimated diode lasers in a single stacked array, the inclination of the optical surfaces in the reflective elements is identical for all diode lasers in the array. On the other hand, the distance between the individual diode lasers and the optical surfaces will change if the reflective elements are monolithic. The reflective elements thus represent a plano-parallel glass plate having varying reflectivity in an alternating sequence from high reflectivity to high transmission.

The inclination angle of any given reflective element should be limited in the fast (Y) axis direction to small values to minimize the resulting astigmatism in subsequent focusing optics between the diode lasers in a single stacked array. The inclination in the fast axis defines the inclination in the slow (X) axis for a given pitch of the stacked array, as well as the distance between the first and second reflective optical elements.

FIGS. 5A–5G illustrate representative embodiments of the reflective elements of the first and second reflective members, particularly as they are incorporated in the embodiment of the inventive apparatus shown (schematically) and described in relation to FIGS. 4A–4C.

Referring specifically to FIGS. 5A–5C, an exemplary reflective element comprising the first reflective member is shown in various elevations to take the form of a fused silica prism including reflective surfaces S1 and S2 each having a high-reflective coating (800–880 nm or 910–980 nm, for example).

Turning now to FIGS. 5D–5G, an exemplary reflective element comprising the first of a pair of such elements forming the second reflective member is shown, the corresponding but oppositely (in the X axis) positioned second reflective element of the second reflective member of this embodiment being similar in all material respects except as otherwise noted. The reflective element of this embodiment takes the form of a "comb" characterized by a plurality of spaced-apart "tines" T arranged seriatum in the Y axis and separated by cut-out portions P. As shown, the number of cut-out portions P and tines T provided in the illustrated embodiment is adapted for a 21-bar type stacked array of diode lasers. Each tine T is dimensioned to deflect, in the manner heretofore described, a portion of the output beam of a single diode laser in a stacked array. The "comb" is formed of fused silica, and includes a reflective surface S1 having a high-reflectivity coating (800–880 nm or 910–980 nm, for instance), and an exemplary surface flatness of $\lambda/4$ at 633 nm. The cut-out portions P, each dimensioned to permit the transmission therethrough of a portion of the output beam of one of the diode lasers in a stacked array, have anti-reflective coated surfaces P1, P2, and P3 oriented transverse to the reflective surface S1. In the embodiment of the illustrated example, the distance between adjacent cut-out portions P is approximately 2 mm, with each cut-out portion P having a width of approximately 1 mm. Relative to the reflective surface S1, the surfaces P1 and P2 of each cut-out portion P are oriented at an angle of approximately 6.2 degrees, such that, when the reflective element is properly inclined relative to the diode laser array, the surfaces P1 and P2 of each cut-out portion are oriented parallel to the path of travel of the un-deflected beam portions. In the second reflective element (not shown) comprising the second reflective member, the surfaces P1 and P2 of the cut-out portions P are oriented at an angle of approximately 6.2 degrees relative to the surface S2 opposing the reflective surface S1, since the second reflective element is oppositely inclined relative to the first reflective element.

Of course, it will be understood that the reflectivity of any coating applied to the first and second reflective members, including in the particular embodiments herein described, may be varied according to the application, and the specific coatings described in this specification are not intended to be limiting of this invention.

Figure 6A:
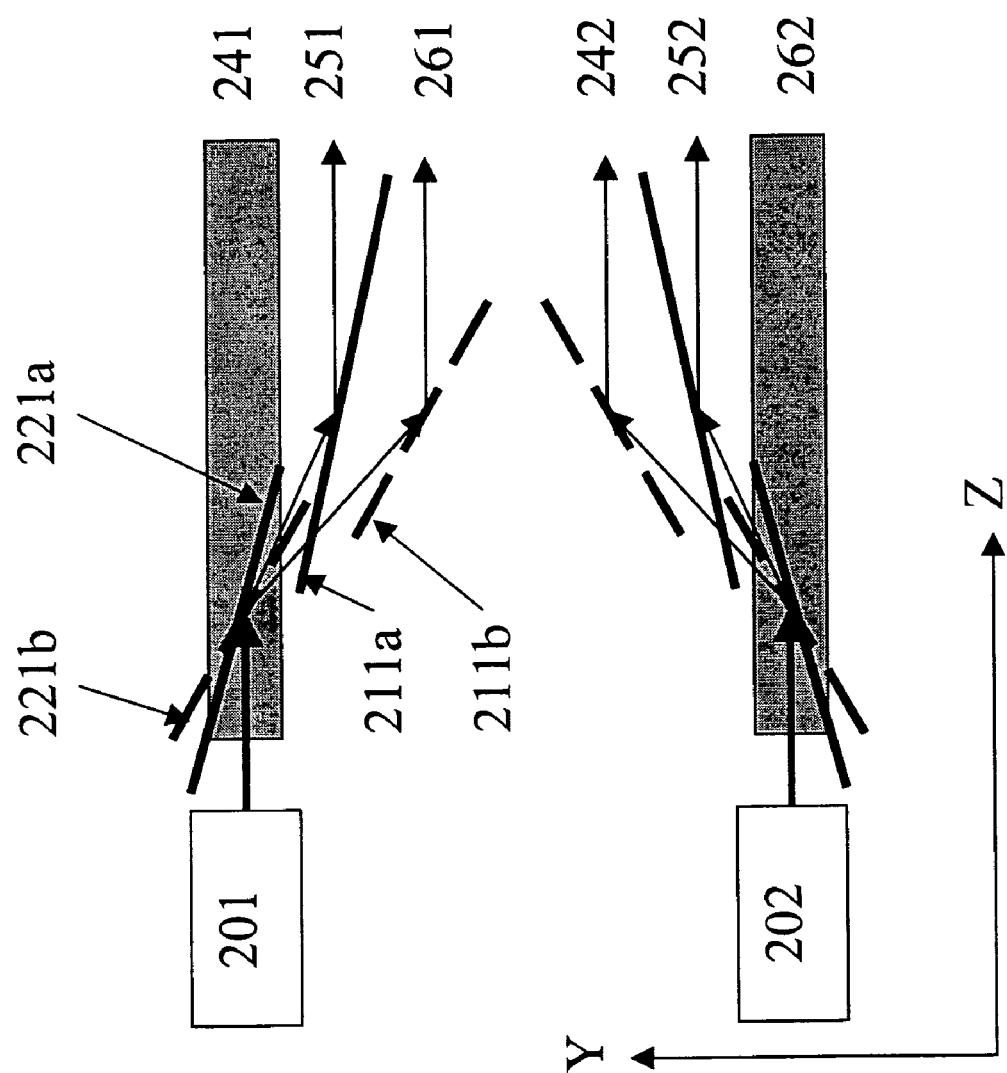
FIG. 6A is a schematic view, taken along the X axis, of a further embodiment of the apparatus of the present invention, wherein the laser beams of a stacked array of high power diode lasers, each having a different wavelength, is reconfigured into three separate beams which are subsequently combined in two illuminated areas.
Figure 6B:
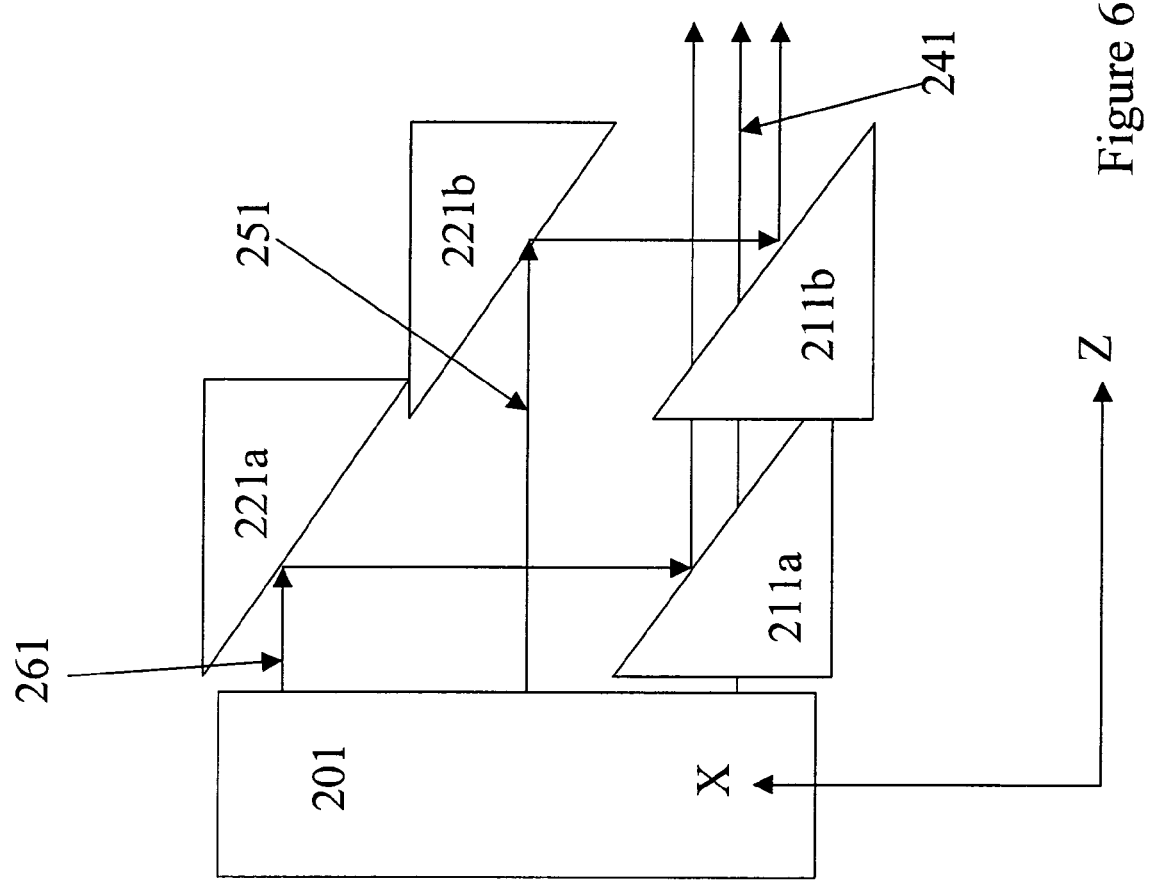
FIGS. 6B and 6C each comprise schematic views, taken along the Y axis, of another embodiment of the apparatus of the present invention, wherein the laser beams of a stacked array of high power diode lasers, each having a different wavelength (one wavelength depicted in each figure), are arranged in alternating sequence, and the beams of each laser are reconfigured into three separate beams which are subsequently combined in two identical illuminated areas.
Figure 6C:
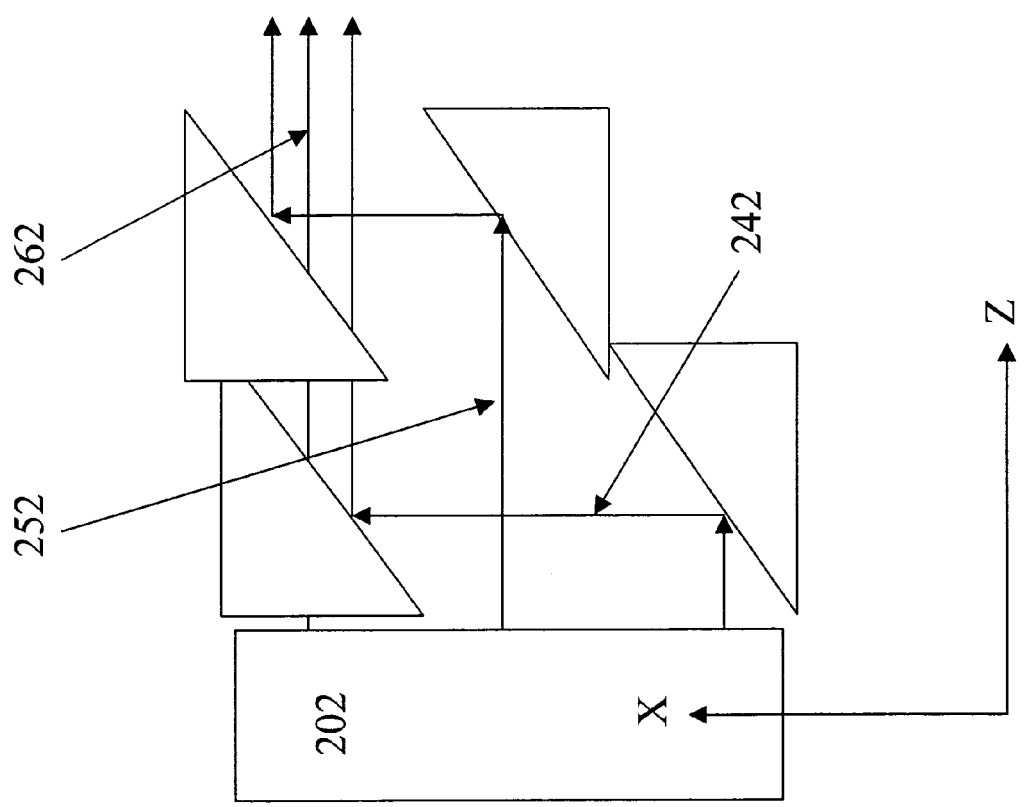

With reference now to FIGS. 6A–6C, a further embodiment of the present invention is shown in combination with a stacked array of diode lasers 201 and 202 having specific, though different, emission wavelengths, the diode lasers 201 and 202 arranged in a specific alternating sequence. According to this embodiment, the first and second reflective members are arranged such that the output beam of the individual diode lasers 201 and 202 are split into an identical number of separate, identical beams, with all such beams of the same wavelength being combined into a common emitting area.

More particularly, a stacked array is shown in schematic view to comprise, for example, two diode lasers 201 and 202, each laser characterized by a different wavelength. FIG. 6A. With particular reference to FIGS. 6B and 6C, the output beam of the diode laser 201 is divided into separate beam portions 251, and 261 by a first reflective member comprising first and second reflective elements 221a and 221b. These beam portions 251 and 261 are deflected at a first angle in the slow axis direction, and at a second, downward (in the fast axis) angle by these reflective elements 221a, 221b. The separate beam portions 251 and 261 are subsequently deflected by a second reflective member comprising first and second reflective elements 211a and 211b. An un-deflected beam portion 241 passes the reflective elements 221 and 221b without being deflected, and is, as shown, positioned above the beams 251 and 261. The beam portions 261 and 251 are deflected by the first and second reflective elements 211a and 211b, respectively, to a path along the Z axis parallel to the beam portion 241 and in close proximity with each other in the fast axis direction, and with no displacement in the slow axis. Accordingly, a light emitting area is created by this alignment of the beam portions 241, 251, and 261 which is characterized by a single wavelength, increased symmetry of beam quality in the slow (X) and fast (Y) axes, and no non-light emitting areas.

In similar fashion to that already described, the output beam of the second diode laser 202 is divided into three separate beam portions 242, 252, and 262 oriented into a single light emitting area also characterized by a single wavelength, increased symmetry of beam quality in the slow and fast axes, and no non-light emitting areas. As shown in FIG. 6A, the distinguishing feature of the beam shaping of the second diode laser 202 is that the beam portions 242 and 252 are deflected at an angle upwardly along the fast axis so as to be arranged above the un-deflected beam portion 262.

It will be appreciated from the foregoing that this embodiment of the present invention creates two identical emitting areas, each having a different wavelength, wherein the center beams are precisely aligned in all axes.

Though the shaping of the output beams of just two diode lasers is shown, it will be understood that any number of diode lasers, or other semiconductor laser, having any number of different wavelengths may be arranged in a specific alternating way in a single stacked array, and further that the number of individual beams into which the output beam of each such laser is shaped may likewise be varied, all depending upon the required brightness of the array.

Figure 7:
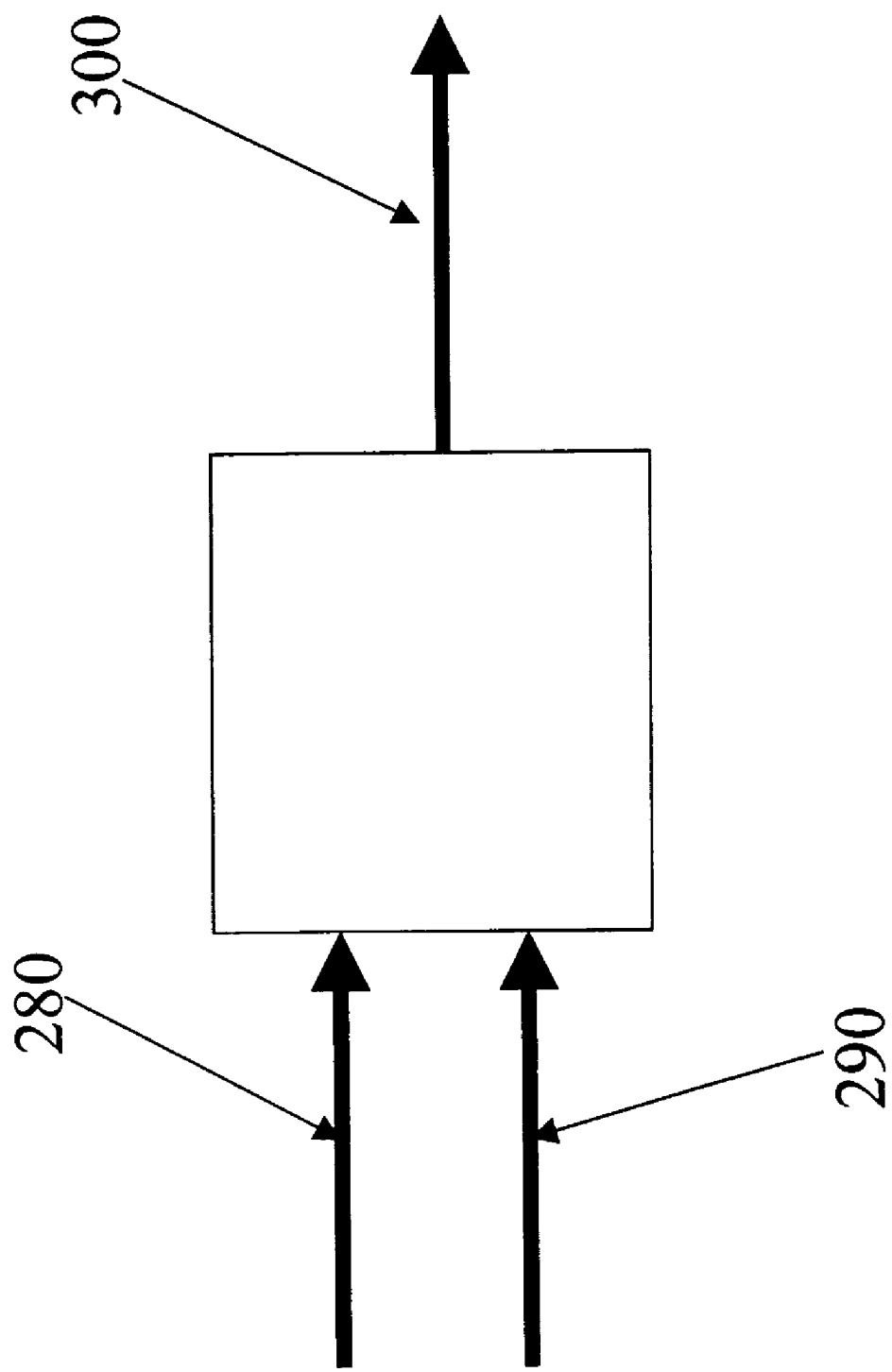
FIG. 7 is a schematic view depicting one possible arrangement for multiplexing individual beams of the apparatus of the present invention into a single beam.

Turning now to FIG. 7, an exemplary arrangement is shown, schematically, for combining the multiple emitting beam areas 280 and 290 of a single stacked array, for instance the stacked array of FIGS. 6A–6C, into a single emitting area 300 by means of, for example, conventional techniques for polarizing or wavelength multiplexing. Alternatively, the two emitting beam areas 280 and 290 may be arranged on top of each other in the fast (Y) axis by means of reflective or refractive optical elements.

Those skilled in the art will appreciate that one or more of the foregoing means may be employed, singly or in combination, to combine multiple emitting areas into a single emitting area, and that the particular arrangement employed depends upon the particular requirements for output power and beam quality.

With reference now being had to FIG. 8A, there is shown the optical near field of a stacked array incorporating the first and second reflective members of any of the embodiments of the invention as described herein, these first and second reflective members being arranged to produce four identical emitting beams areas 501, 502, 503, and 504, all spaced equidistant from each other, and in precise parallel alignment, in both the fast (Y) and slow (X) axes. Depending upon the composition of the stacked array, the beams 501, 502, 503, and 504 may be characterized by the same or different wavelengths, and may further have one or multiple polarizations.

Referring now to FIG. 8B, each of the beams may pass an optical switch, as exemplified by the optical switches 601 and 603 shown for beams 501 and 503 in the view of an exemplary stacked array taken along the slow (X) axis, such that the output power of each beam may be independently varied. In combination with the precise alignment of the separate beams in six axes, it will be appreciated that the embodiment described herein is well suited for use in a dot matrix printing device, for example.

Still referring to FIG. 8B, the individual beams may further be shaped by optical elements, such as optical elements 701 and 703 shown in the path of beams 501 and 503, for imaging on a work-piece or coupling into a fiber array, for instance, according to conventional means.

Of course, the foregoing is merely illustrative of the present invention according to several embodiments thereof. Those of ordinary skill in the art will appreciate that many additions and modifications to the present invention, as set out in this disclosure, are possible without departing from the spirit and broader aspects of this invention as defined in the appended claims.

The invention in which an exclusive property or privilege is claimed is defined as follows:

1. An apparatus for shaping part of the collective output beam of a strip of semiconductor lasers, the strip of semiconductor lasers being arranged to define a plurality of light-emitting areas and a plurality of non-light-emitting areas, and the strip of semiconductor lasers having dimensions in X, Y and Z axes, wherein the Y axis defines the fast axis, the X axis defines the slow axis, and the Z axis defines an axis of propagation for the output beam, the apparatus comprising:

A first reflective member comprising at least a first reflective element positioned a fixed distance from the strip of semiconductor lasers, the at least first reflective element adapted to deflect a first portion of the output beam in a first direction oriented at a first non-zero angle in the slow axis direction and at a second non-zero angle in the fast axis direction;

At least a second reflective member comprising at least a first reflective element positioned a fixed distance from the strip of semiconductor lasers, the at least first reflective element of the second reflective member adapted to deflect the first portion of the output beam from the first direction to a second direction in the Z axis direction; and Whereby the output beam is shaped to define at least two beams comprising at least the first portion and a remainder of the output beam which is propagated along the Z axis without deflection by either of the first or at least second reflective members, with the first portion of the output beam being oriented approximately parallel to the un-deflected remainder of the output beam, and the non-light-emitting areas are substantially eliminated from the output beam.

2. The apparatus of claim 1, wherein:

the first reflective member further comprises a second reflective element positioned a fixed distance from the strip of semiconductor lasers, the second reflective element adapted to deflect a second portion of the output beam in a third direction oriented at a third non-zero angle in the slow axis direction and at a fourth non-zero angle in the fast axis direction;

the at least second reflective member further comprising a second reflective element positioned a fixed distance from the strip of semiconductor lasers, the at least second reflective element of the second reflective member adapted to deflect the second portion of the output beam from the third direction to a fourth direction in the Z axis direction; and whereby the first and second portions of the output beam are oriented approximately parallel to each other and to the un-deflected remainder of the output beam, and the non-light-emitting areas are substantially eliminated from the output beam.

3. The apparatus of claim 2, wherein the third direction is approximately opposite the first direction, the first and third angles are approximately the same, the second and fourth angles are approximately the same, and the second and fourth directions are approximately the same.

4. The apparatus of claim 2, further comprising at least one optical member adapted to balance the optical path length of the un-deflected remainder of the output beam, the at least one optical member being disposed at a fixed position on the axis of propagation of the un-deflected remainder of the output beam.

5. The apparatus of claim 1, further comprising:
the first reflective element of the first reflective member further adapted to deflect a second portion of the output beam in a third direction oriented at a third non-zero angle in the slow axis direction and at a fourth non-zero angle in the fast axis direction;
the at least second reflective member further comprising a second reflective element positioned a fixed distance from the strip of semiconductor lasers, the at least second reflective element of the second reflective member adapted to deflect the second portion of the output beam from the third direction to a fourth direction in the Z axis direction; and
whereby the first and second portions of the output beam are oriented approximately parallel to each other and to the un-deflected remainder of the output beam, and the non-light-emitting areas are substantially eliminated from the output beam.

6. The apparatus of claim 5, wherein the third direction is approximately opposite the first direction, the first and third angles are approximately the same, the second and fourth angles are approximately the same, and the second and fourth directions are approximately the same.

7. The apparatus of claim 5, further comprising at least one optical member adapted to balance the optical path length of the un-deflected remainder of the output beam, the at least one optical member being disposed at a fixed position on the axis of propagation of the un-deflected remainder of the output beam.

8. An apparatus for shaping part of the collective output beam of a plurality of semiconductor lasers comprising individual bars of semiconductor lasers stacked one on top of the other to form an array, the plurality of semiconductor lasers being arranged to define a plurality of light-emitting areas and a plurality of non-light-emitting areas, and the semiconductor lasers having dimensions in X, Y and Z axes, wherein the Y axis defines the fast axis, the X axis defines the slow axis, and the Z axis defines an axis of propagation for the output beam, the apparatus comprising:
a first reflective member comprising at least a first reflective element positioned a fixed distance from each bar in the array, the at least first reflective element adapted to deflect a first portion of the output beam from each bar in the array in a first direction oriented at a first non-zero angle in the slow axis direction and at a second non-zero angle in the fast axis direction;
at least a second reflective member comprising at least a first reflective element positioned a fixed distance from each bar in the array, the at least first reflective element of the second reflective member adapted to deflect the first portion of the output beam from each bar in the array from the first direction to a second direction in the Z axis direction; and
whereby the output beam of each bar in the array is shaped to define at least two beams comprising at least the first portion and a remainder of the output beam which is propagated along the Z axis without deflection by either of the first or at least second reflective members, with the first portion of the output beam being oriented approximately parallel to the un-deflected remainder of the output beam, and the non-light-emitting areas are substantially eliminated from the output beam.

9. The apparatus of claim 8, wherein:
the first reflective member further comprises a second reflective element positioned a fixed distance from each bar in the array, the second reflective element adapted to deflect a second portion of the output beam from each bar in a third direction oriented at a third non-zero angle in the slow axis direction and at a fourth non-zero angle in the fast axis direction;
the at least second reflective member comprising a second reflective element positioned a fixed distance from each bar in the array, the at least second reflective element of the second reflective member adapted to deflect the second portion of the output beam of each bar from the third direction to a fourth direction in the Z axis direction; and
whereby the first portion and second portion of the output beams of each bar in the array are oriented approximately parallel to the un-deflected remainder of the output beams of each bar, and the non-light-emitting areas are substantially eliminated from the output beams.

10. The apparatus of claim 9, wherein the third direction is approximately opposite the first direction, the first and third angles are approximately the same, the second and fourth angles are approximately the same, and the second and fourth directions are approximately the same.

11. The apparatus of claim 9, further comprising at least one optical member adapted to balance the optical path length of the un-deflected remainder of the output beam of at least one of the bars in the array, the at least one optical member being disposed at a fixed position on the axis of propagation of the un-deflected remainder of the output beam.

12. The apparatus of claim 8, further comprising:
the at least first reflective element of the first reflective member further adapted to deflect a second portion of the output beam of each bar in a third direction oriented at a third non-zero angle in the slow axis direction and at a fourth non-zero angle in the fast axis direction;
the at least second reflective member further comprising a second reflective element positioned a fixed distance from each bar in the array, the at least second reflective element of the second reflective member adapted to deflect the second portion of the output beam from the third direction to a fourth direction in the Z axis direction; and
whereby the first portion and second portion of the output beams of each bar in the array are oriented approximately parallel to the un-deflected remainder of the output beams of each bar, and the non-light-emitting areas are substantially eliminated from the output beams.

13. The apparatus of claim 12, wherein the third direction is approximately opposite the first direction, the first and thirds angles are approximately the same, the second and fourth angles are approximately the same, and the second and fourth directions are approximately the same.

14. The apparatus of claim 12, further comprising at least one optical member adapted to balance the optical path length of the un-deflected remainder of the output beam of at least one bar in the array, the at least one optical member being disposed at a fixed position in the axis of propagation of the un-deflected remainder of the output beam.

15. The apparatus of claim 8, wherein the total height of the first and second reflective members corresponds to the pitch of the semiconductor lasers in the array.

16. The apparatus of claim 8, wherein the output beams of each bar in the array are propagated in a direction substantially perpendicular to a plane defined by the X and Y axes.

17. The apparatus of claim 12, wherein the total height of the first and second reflective members corresponds to the pitch of the semiconductor lasers in the array.

18. The apparatus of claim 12, wherein the output beams of each bar in the array are propagated in a direction substantially perpendicular to a plane defined by the X and Y axes.

19. The apparatus of either claim 8 or claim 12, wherein the at least first element of the second reflective member comprises a monolithic element having a plurality of individual reflective portions each adapted to reflect a portion of the output beam of a discrete one of the bars in the array, and a plurality of cut-out portions defined between adjacent reflective portions, each cut-out portion adapted to permit transmission therethrough of a portion of the output beam of a discrete one of the bars in the array.

20. The apparatus of claim 19, wherein the cut-out portions include opposing inside surfaces, each of which inside surfaces is oriented approximately parallel to the path of travel of the portion of the output beam transmitted therethrough.

21. The apparatus of claim 20, wherein the opposing inside surfaces of each cut-out portion include an anti-reflective coating.

* * * * *